US012808049B2

(12) United States Patent

Yang et al.

(10) Patent No.: US 12,808,049 B2

(45) Date of Patent: Nov. 24, 2026

(54) SEMICONDUCTOR MANUFACTURING APPARATUS AND SUBSTRATE TREATMENT METHOD USING THE SAME

(71) Applicant: SAMSUNG ELECTRONICS CO., LTD., Suwon-si (KR)

(72) Inventors: Jae Hyun Yang, Hwaseong-si (KR); Tae Yong Kim, Suwon-si (KR); Sang Yub Ie, Hwaseong-si (KR); Jung Geun Jee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 900 days.

(21) Appl. No.: 18/005,849

(22) PCT Filed: Dec. 18, 2020

(86) PCT No.: PCT/KR2020/018723

§ 371 (c)(1),
(2) Date: Jan. 17, 2023

(87) PCT Pub. No.: WO2022/034996

PCT Pub. Date: Feb. 17, 2022

(65) Prior Publication Data

US 2023/0272532 A1 Aug. 31, 2023

(30) Foreign Application Priority Data

Aug. 12, 2020 (KR) ........................ 10-2020-0101200

(51) Int. Cl.

*C23C 16/455* (2006.01)
*C23C 16/458* (2006.01)

(Continued)

(52) U.S. Cl.

CPC .. *C23C 16/45578* (2013.01); *C23C 16/45548* (2013.01); *C23C 16/4583* (2013.01);

(Continued)

(58) Field of Classification Search

CPC ........ C23C 16/45578; C23C 16/45548; C23C 16/4583; H10P 72/0431; H10P 14/24; H10P 14/40; H10P 14/6339; H10P 95/90

See application file for complete search history.

(56) References Cited

U.S. PATENT DOCUMENTS 5,851,294 A * 12/1998 Young ............... C23C 16/45563 156/345.33

11,993,848 B2 * 5/2024 Sakashita .......... C23C 16/45578

(Continued)

FOREIGN PATENT DOCUMENTS

JP 2002075978 3/2002
JP 2002075978 A * 3/2002

(Continued)

OTHER PUBLICATIONS

Office Action dated Aug. 7, 2025 issued in Taiwanese Patent Application No. TW 110142382. Note: JP 2002-75978 A and JP 2018-78323 A cited therein are already of record.

*Primary Examiner* — Fernando L Toledo
*Assistant Examiner* — Jahae Kim
(74) *Attorney, Agent, or Firm* — MORGAN, LEWIS & BOCKIUS LLP

(57) ABSTRACT

There is provided a semiconductor manufacturing apparatus which reduces loss of a process gas or a precursor transferred from a nozzle to a wafer by improving the injection efficiency of the process gas or the precursor from the nozzle to the substrate. The semiconductor manufacturing apparatus includes a boat on which a substrate is loaded in a first direction, an inner tube which covers the boat, a nozzle which extends in the first direction and through which a process gas to be provided to the substrate moves, a nozzle tube which surrounds the nozzle and comprises a gas injection hole for injecting the process gas toward the substrate, and a nozzle protrusion which is connected to the (Continued)

gas injection hole and extends in a second direction, wherein a shortest distance from an end of the nozzle protrusion to the substrate is greater than 0 mm and less than 9 mm.

9 Claims, 7 Drawing Sheets

(51) Int. Cl.

| | |
|---|---|
| ***H10P 72/00*** | (2026.01) |
| ***H10P 95/90*** | (2026.01) |
| *H10P 14/24* | (2026.01) |
| *H10P 14/40* | (2026.01) |
| *H10P 14/60* | (2026.01) |

(52) U.S. Cl.

CPC .......... *H10P 72/0431* (2026.01); *H10P 14/24* (2026.01); *H10P 14/40* (2026.01); *H10P 14/6339* (2026.01); *H10P 95/90* (2026.01)

(56) References Cited

U.S. PATENT DOCUMENTS

| | | | |
|---|---|---|---|
| 2006/0216947 | A1 | 9/2006 | Choi et al. |
| 2009/0305512 | A1 | 12/2009 | Matsuura et al. |
| 2019/0360098 | A1* | 11/2019 | Shimada .......... C23C 16/45504 |
| 2020/0024731 | A1 | 1/2020 | Horita et al. |

FOREIGN PATENT DOCUMENTS

| | | | |
|---|---|---|---|
| JP | 2018078323 | | 5/2018 |
| KR | 1999-0020319 | A | 3/1999 |
| KR | 10-2007-0095564 | | 10/2007 |
| KR | 1999-0020319 | | 6/2019 |
| TW | 202012691 | A | 4/2020 |
| WO | 2007/043478 | A1 | 4/2007 |

* cited by examiner

SEMICONDUCTOR MANUFACTURING APPARATUS AND SUBSTRATE TREATMENT METHOD USING THE SAME

CROSS REFERENCE TO RELATED APPLICATIONS

The present application is a National Stage application, filed under 35 U.S.C. § 371, of International Patent Application No. PCT/KR2020/018723, filed on Dec. 18, 2020, which claims priority to Korean Patent Application No. KR 10-2020-0101200, filed on Aug. 12, 2020, the contents of which are incorporated by reference herein in their entirety.

TECHNICAL FIELD

The present disclosure relates to semiconductors and, more specifically, to a semiconductor manufacturing apparatus and a substrate treatment method using the same.

DISCUSSION OF THE RELATED ART

Recently, as semiconductor apparatuses become highly integrated, design rules are being reduced. Therefore, the area occupied by a unit cell in a semiconductor apparatus is reduced, and the line width of a pattern is reduced. Accordingly, the thickness of a thin film is gradually reduced, and it may be difficult to form a substrate having step coverage.

Meanwhile, an atomic layer deposition (ALD) apparatus for forming a thin film with an atomic layer thickness is being developed. The ALD apparatus injects a source gas and a reaction gas onto a substrate to grow a thin film. Here, sufficient supply of process gas may be needed and sufficient exhaust may be needed to support the ALD apparatus.

SUMMARY

A batch-type semiconductor manufacturing apparatus includes a boat on which a substrate is loaded in a first direction, an inner tube coverings the boat, a nozzle extending in the first direction and through which a process gas to be provided to the substrate moves, a nozzle tube surrounding the nozzle and including a gas injection hole for injecting the process gas toward the substrate, and a nozzle protrusion connected to the gas injection hole and extending in a second direction. A shortest distance from an end of the nozzle protrusion to the substrate is greater than 0 mm and less than 9 mm.

A semiconductor substrate treatment method include loading a substrate on a boat in a first direction, moving a process gas, which is to be injected to the substrate, through a nozzle extending in the first direction, injecting the process gas to the substrate through a gas injection hole of a nozzle tube which at least partially surrounds the nozzle and includes the gas injection hole, and letting the process gas move along a nozzle protrusion, which is connected to the gas injection hole and extends in a second direction, and then be injected toward the substrate. The nozzle protrusion is inserted into a slit opening stacked in the first direction to inject the gas to the substrate.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE DRAWINGS

Figure 1:
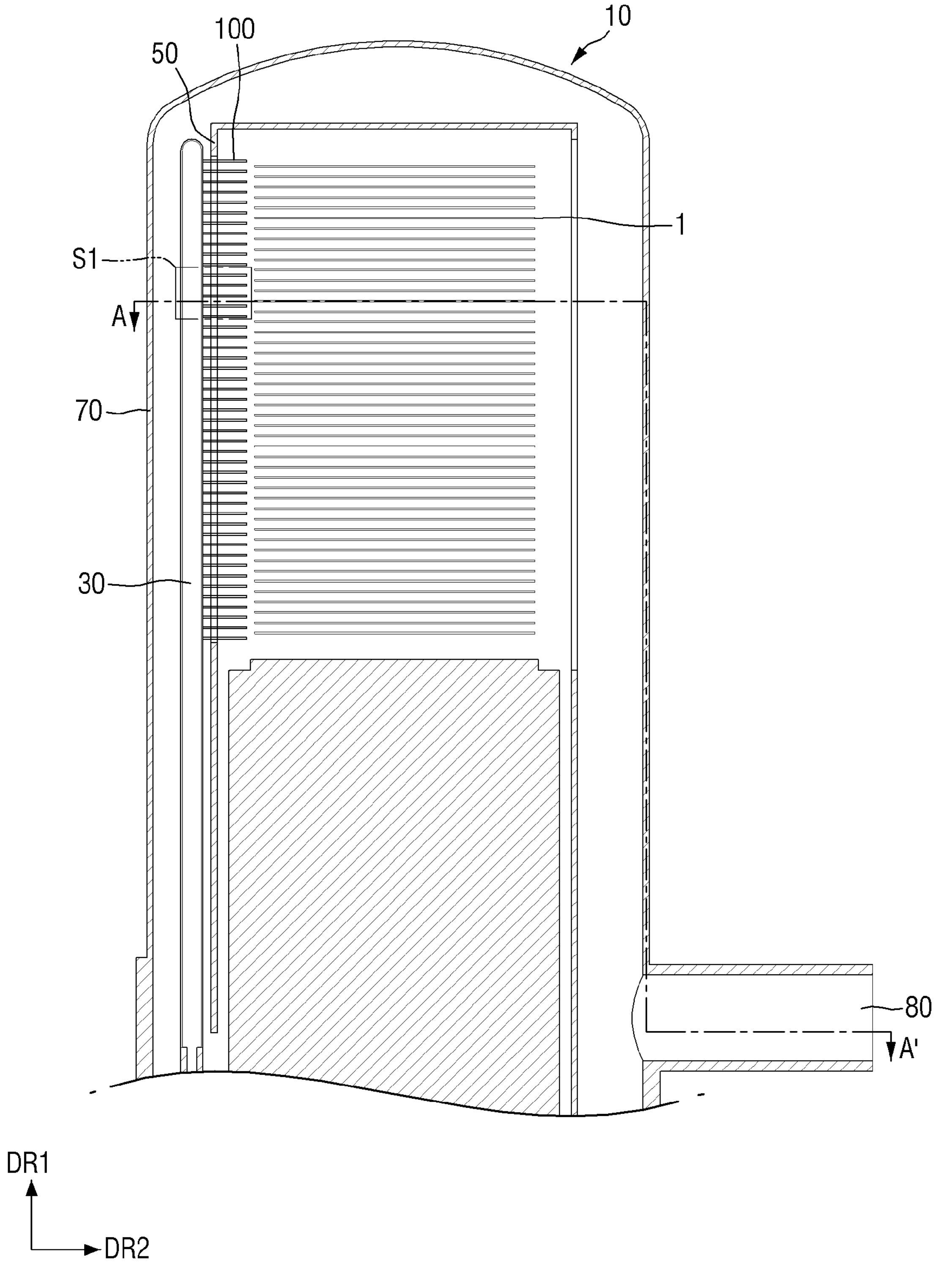
FIG. 1 is an exemplary view of a semiconductor manufacturing apparatus according to embodiments of the present disclosure.
Figure 2:
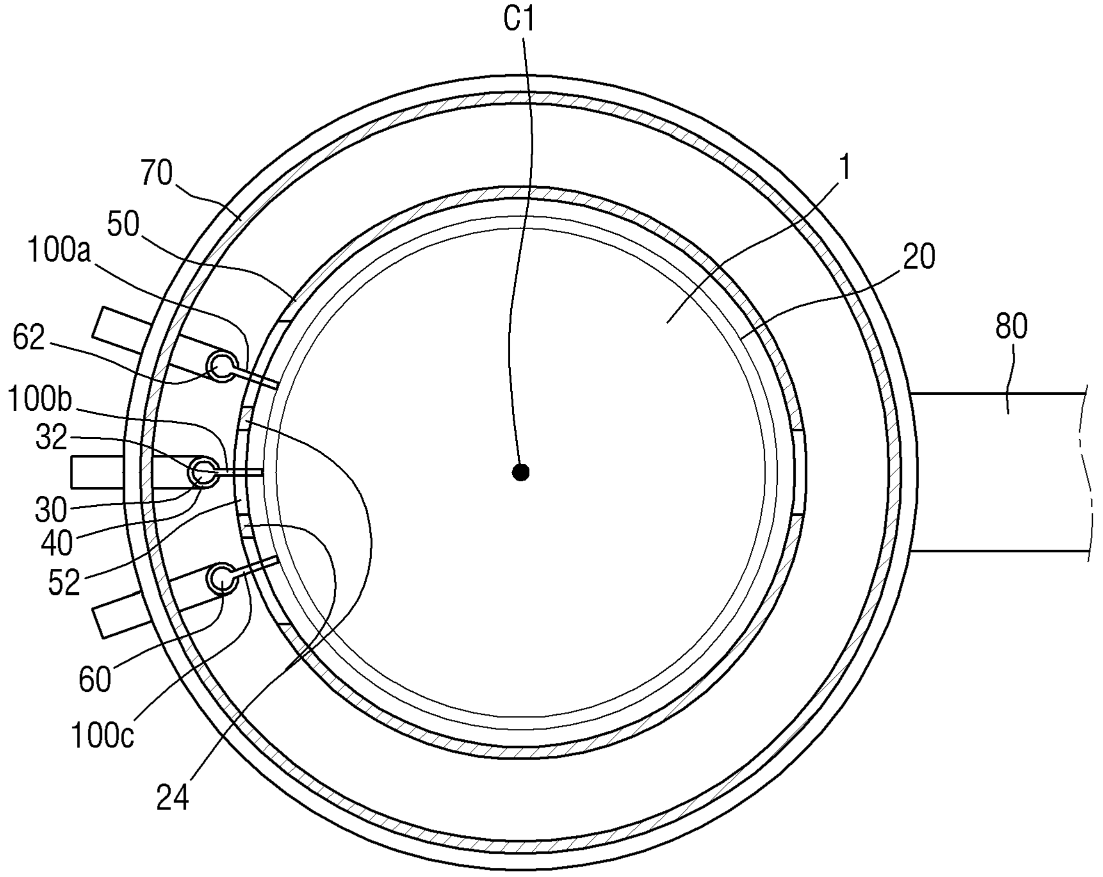
FIG. 2 is a cross-sectional view of the semiconductor manufacturing apparatus according to the embodiments of FIG. 1, taken along line A-A'.

FIG. 1 is an exemplary view of a semiconductor manufacturing apparatus according to embodiments of the present disclosure. FIG. 2 is a cross-sectional view of the semiconductor manufacturing apparatus according to the embodiments of FIG. 1, taken along line A-A'.

Referring to FIGS. 1 and 2, the semiconductor manufacturing apparatus, according to embodiments of the present disclosure, may include a process chamber 10 including a boat 20, slits 24, a nozzle 30, a nozzle tube 40, an inner tube 50, an outer tube 70, and a gas exhaust pipe 80.

The semiconductor manufacturing apparatus according to embodiments of the present disclosure may be an apparatus for performing a semiconductor manufacturing process by supplying a process gas onto a substrate 1 such as a wafer. The semiconductor manufacturing apparatus, according to embodiments of the present disclosure may be, for example, an atomic layer deposition (ALD) apparatus. The semiconductor manufacturing apparatus, according to embodiments of the present disclosure, is not necessarily limited thereto and may also be various deposition apparatuses for depositing a thin film on the substrate 1 by using a process gas or a precursor. The semiconductor manufacturing apparatus, according to embodiments of the present disclosure, is not necessarily limited thereto and may also be used in deposition using a process gas or in an annealing process. For ease of description, a case where the semiconductor manufacturing apparatus, according to embodiments of the present disclosure, uses a process gas will be described below. The semiconductor manufacturing apparatus according to embodiments of the present disclosure may be a batch-type apparatus.

The process chamber 10 may extend mainly in a first direction DR1. The process chamber 10 may provide an internal space for performing a semiconductor manufacturing process on a substrate 1. The process chamber 10 may be made of a material that can withstand high temperatures, for example, quartz or silicon carbide (SiC). The semiconductor manufacturing apparatus, according to embodiments of the present disclosure, may further include a heater covering the process chamber 10 and heating the process chamber 10.

The boat 20 may be disposed inside the process chamber 10. The boat 20 may accommodate a plurality of substrates 1 in the first direction DR1.

The nozzle 30 may be disposed inside the process chamber 10. The nozzle 30 may extend mainly in the first direction DR1. The nozzle 30 may be a passage through which a process gas moves.

The nozzle 30 may include a gas injection hole 32. The gas injection hole 32 may inject a process gas into the process chamber 10. For example, a process gas moving through the nozzle 30 may be injected onto a substrate 1 through the gas injection hole 32. The gas injection hole 32 may inject, for example, a process gas for forming a thin film on the substrate 1.

In addition, the semiconductor manufacturing apparatus, according to embodiments of the present disclosure, may further include one or more auxiliary gas nozzles 60 and 62. The auxiliary gas nozzles 60 and 62 may be disposed around the nozzle 30 for injecting a process gas. The auxiliary gas nozzles 60 and 62 may be disposed horizontally symmetrically in a second direction DR2 with respect to the nozzle 30 for injecting a process gas. The auxiliary gas nozzles 60 and 62 may inject an auxiliary gas so that the process gas can be spread to the center of the substrate 1. The arrangement of the auxiliary gas nozzles and/or the number of the auxiliary gas nozzles are not necessarily limited to those illustrated in the current drawings.

The inner tube 50 may have a substantially cylindrical shape with an open bottom. A cross section of the inner tube 50 may have a substantially circular ring shape. The inner tube 50 may cover the boat 20. The inner tube 50 may include a slit opening 52 formed by opening at least a part of the inner tube 50.

The outer tube 70 may have a substantially circular ring shape. The outer tube 70 may cover the inner tube 50.

The gas exhaust pipe 80 may be provided at a side of the process chamber 10. The gas exhaust pipe 80 may extend mainly along the second direction DR2. The second direction DR2 may be a direction intersecting the first direction DR1. For example, the second direction DR2 may be a direction perpendicular to the first direction DR1. A process gas inside the process chamber 10 may be discharged to the outside of the process chamber 10 through the gas exhaust pipe 80.

The nozzle tube 40 may cover the nozzle 30 and the gas injection hole 32. For example, at least a part of the nozzle tube 40 may be opened to form the gas injection hole 32. The gas injection hole 32 may face the substrate 1. For example, the nozzle tube 40 may at least partially surround the nozzle 30 and may include the gas injection hole 32 open toward the substrate 1.

The nozzle 30 may be connected to a nozzle protrusion **100*b* protruding toward the substrate 1. For example, the nozzle protrusion 100*b* may be connected to the gas injection hole 32. The nozzle protrusion 100*b* may be inserted into the slit opening 52. For example, the nozzle protrusion 100*b* may be inserted into the slit opening 52 and disposed inside the inner tube 50**.

For example, in the semiconductor manufacturing apparatus, according to embodiments of the present disclosure, a process gas might not be lost between the gas injection hole 32 and the inner tube 50. For example, in the semiconductor manufacturing apparatus according to embodiments of the present disclosure, a process gas moved through the nozzle 30 may be transferred to the substrate 1 through the nozzle protrusion **100*b* connected to the gas injection hole 32** without loss of flux of the process gas.

The description of the nozzle protrusion **100*b* connected to the nozzle 30 is applicable to the description of nozzle protrusions 100*c* and 100*a* connected to the auxiliary nozzles 60 and 62**, respectively.

The number of auxiliary nozzles is not necessarily limited to that illustrated in the current drawings and may be, for example, three or more.

The semiconductor manufacturing apparatus, according to embodiments of the present disclosure, which reduces the flux loss of the process gas injected toward the substrate 1 through the nozzle protrusion will now be described in detail with reference to FIG. 3.

Figure 3:
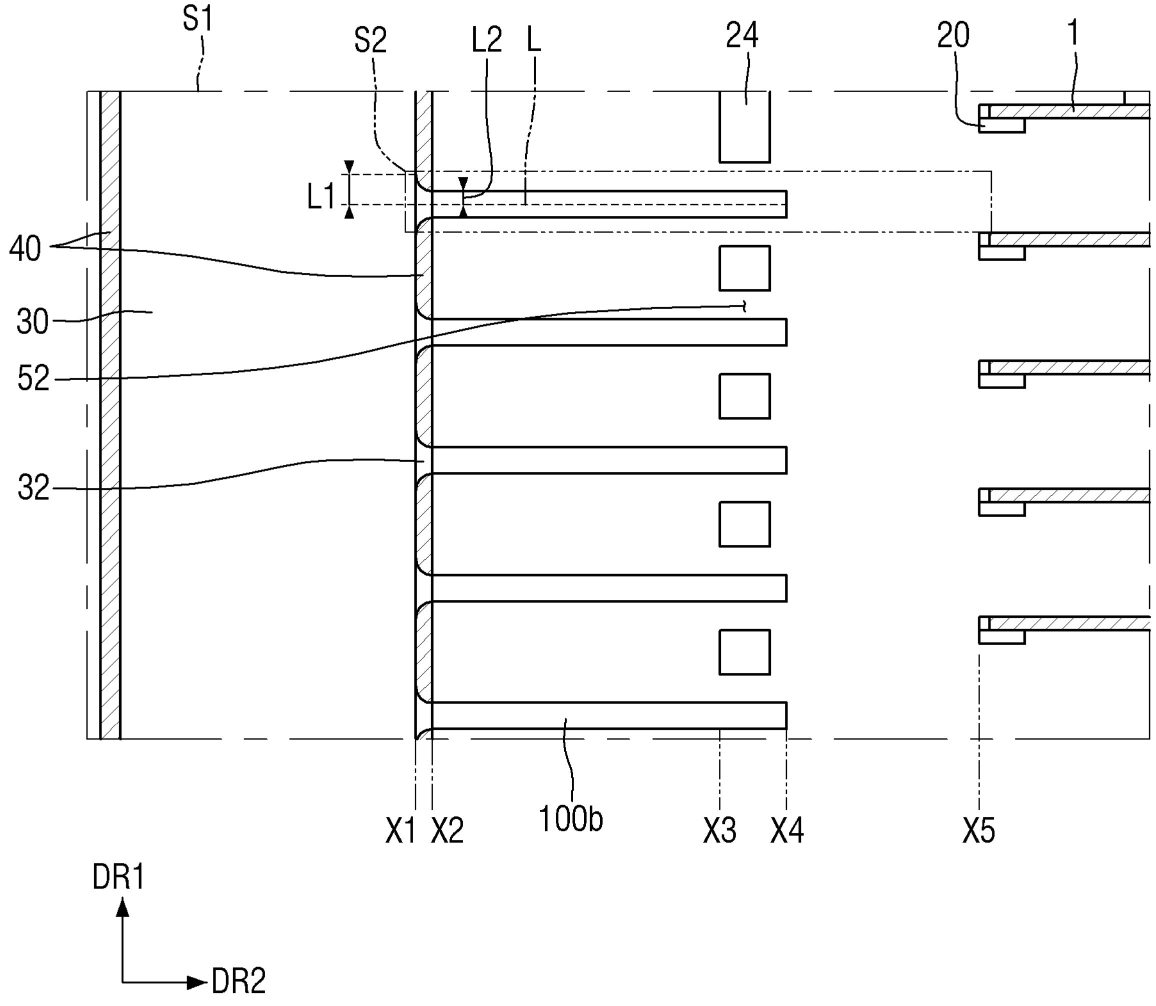
FIG. 3 is an enlarged view of an area S1 of FIG. 1.

FIG. 3 is an enlarged view of an area S1 of FIG. 1.

Referring to FIGS. 1 through 3, each of a plurality of substrates 1 may be loaded on the boat 20 along the first direction DR1.

The inner tube 50 may at least partially cover the boat 20. The inner tube 50 may include a plurality of slit openings 52 formed in the first direction DR1. For example, the slit openings 52 may be stacked in the first direction DR1. The slit openings 52 may be formed along a sidewall of the boat 20 extending mainly in the first direction DR1. For example, the slit openings 52 may be formed along the sidewall of the boat 20.

Each of the slit openings 52 through which the nozzle protrusion **100*b* passes may be formed at a position between the slits 24** neighboring each other.

The nozzle protrusion **100*b*, the auxiliary nozzle protrusion 100*a*, and the auxiliary nozzle protrusion 100*c* may be formed adjacent to each other with a slit 24** interposed between them.

Therefore, the number of the slit openings 52 through which the nozzle protrusion **100*b* passes may be the same as the number of the substrates 1 loaded on the boat 20**.

A sidewall of the nozzle 30 extending mainly in the first direction DR1 may include a plurality of openings. The nozzle 30 may include the gas injection hole 32 at a position corresponding to each of the openings. The nozzle protrusion **100*b* may be connected to the gas injection holes 32 described above and may extend mainly in the second direction DR2. For example, the number of the gas injection holes 32 and the number of the nozzle protrusions 100*b*** may be the same.

The nozzle protrusions **100*b* may be formed at positions corresponding to the slit openings 52. A center point of each nozzle protrusion 100*b* and a center point of each slit opening 52 may be located on a center line L. However, in the semiconductor manufacturing apparatus, according to embodiments of the present disclosure, the center point of each nozzle protrusion 100*b* and the center point of each slit opening 52** may also be disposed at positions not on the center line L.

The nozzle tube 40 may at least partially cover an outer circumferential surface of the nozzle 30 and outer circumferential surfaces of the gas injection holes 32. For example, the nozzle tube 40 may include openings at positions corresponding to the gas injection holes 32. For example, a position X1 at which the formation of the gas injection holes 32 starts may be the same as a position X1 at which the openings of the nozzle tube 40 start, and a position X2 at which the formation of the gas injection holes 32 ends may be the same as a position X2 at which the openings of the nozzle tube 40 end.

The nozzle protrusions 100*b* may be connected to the position X2 at which the formation of the gas injection holes 32 ends. In addition, the nozzle protrusions 100*b* may extend mainly in the second direction DR2 and may be inserted into the slit openings 52. For example, since a process gas injected from the gas injection holes 32 is moved through the nozzle protrusions 100*b*, it might not be lost in a space (from X2 to X3) between the nozzle tube 40 and the inner chamber 50. Therefore, the semiconductor manufacturing apparatus, according to embodiments of the present disclosure, may reduce the flux loss of the process gas supplied from the nozzle 30 through the nozzle protrusions 100*b*. For example, the semiconductor manufacturing apparatus according to embodiments of the present disclosure may obtain increased injection efficiency of the process gas moving from the nozzle 30 to the substrates 1.

In the current drawing, a point X4 at which the process gas is injected from the nozzle protrusions 100*b*, for example, an end X4 of each nozzle protrusion 100*b* in the second direction DR2 is located between a slit 24 and the boat 20. However, the present disclosure is not necessarily limited thereto, and the end X4 may also be located inside the slit 24 (X3 to X4). Alternatively, the end X4 of each nozzle protrusion 100*b* in the second direction DR2 may be located on an edge X5 of a substrate 1.

The nozzle protrusions 100*b* will now be described in detail with reference to FIG. 4 which is an enlarged view of an area S2.

Figure 4:
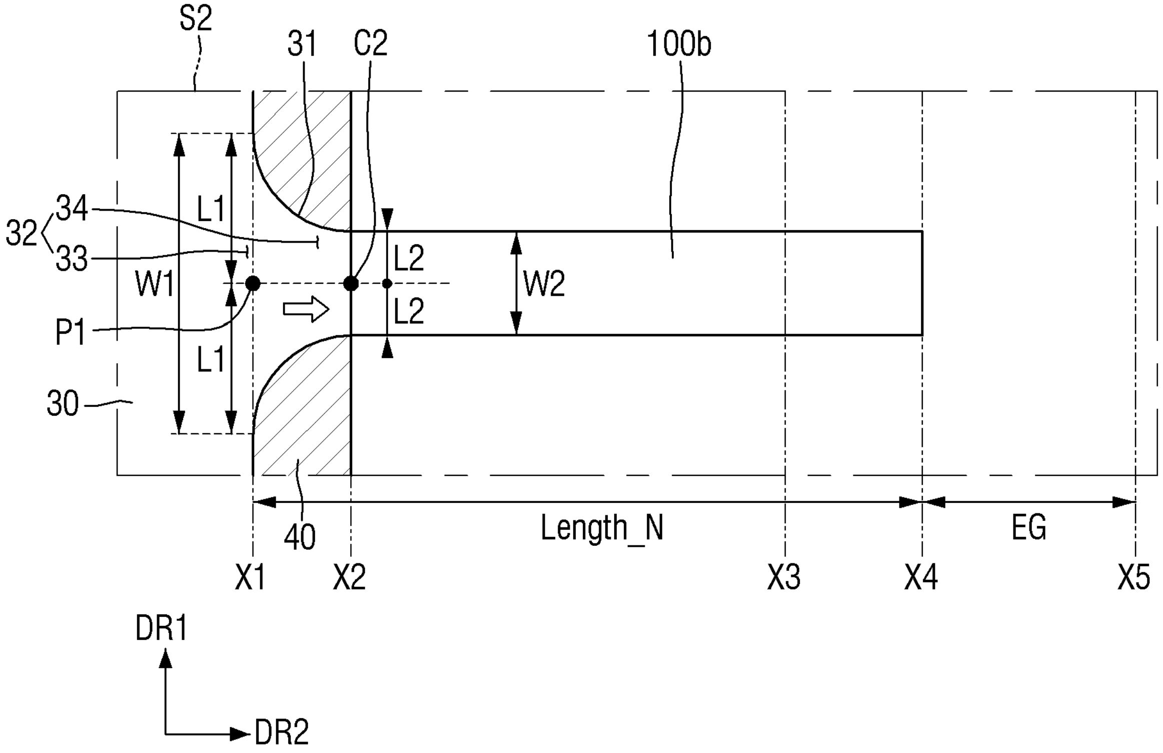
FIG. 4 is an enlarged view of the area S2 of FIG. 3.

FIG. 4 is an enlarged view of the area S2 of FIG. 3.

Referring to FIGS. 3 and 4, a gas injection hole 32 may include an inlet 33 having a first diameter W1 and an outlet 34 having a second diameter W2. A process gas moved from the nozzle 30 may be introduced into the inlet 33. The process gas introduced into the inlet 33 may move to a nozzle protrusion 100*b* through the outlet 34. For example, the process gas may sequentially move along the nozzle 30, the gas injection hole 32 and the nozzle protrusion 100*b* and then may be injected toward a substrate 1 at an end point X4 of the nozzle protrusion 100*b*.

For example, the inlet 33 may be a point X1 at which the gas injection hole 32 starts, and the outlet 34 may be an open surface of a point X2 at which the gas injection hole 32 ends. In the semiconductor manufacturing apparatus according to embodiments of the present disclosure, the first diameter W1 is greater than the second diameter W2. For example, a value obtained by dividing the second diameter W2 by the first diameter W1 may be greater than 0.6 and less than 1. For example, the value obtained by dividing the second diameter W2 by the first diameter W1 may be 0.63.

A fluid passage surface 31 defined as a surface where the gas injection hole 32 and the nozzle tube 40 meet may have a curved surface. For example, the curvature of the fluid passage surface 31 may be greater than 0 mm and less than 0.5 mm.

Since the fluid passage surface 31 has a curvature, stress applied to the fluid passage surface 31 may be relieved, thereby increasing the durability of the surface where the nozzle protrusion 100*b* and the nozzle tube 40 meet.

In the semiconductor manufacturing apparatus according to embodiments of the present disclosure, a distance L1 from a center point P1 of the inlet 33 to a point at which an imaginary line extending mainly in the first direction DR1 meets the nozzle tube 40 may be half the first diameter W1.

In the semiconductor manufacturing apparatus according to embodiments of the present disclosure, a distance L2 from a center point C2 of the outlet 34 to a point at which an imaginary line extending mainly in the first direction DR1 meets the nozzle tube 40 may be half the second diameter W2.

In the semiconductor manufacturing apparatus according to embodiments of the present disclosure, the center point P1 of the inlet 33 and the center point C2 of the outlet 34 might not lie on a straight line in the second direction DR2.

As described above, since the surface (the fluid passage surface 31) where the gas injection hole 32 and the nozzle tube 40 meet is curved, the flow resistance of the process gas moving from the nozzle 30 is reduced, which, in turn, increases the flow rate of the process gas in the gas injection hole 32. For example, in the semiconductor manufacturing apparatus according to embodiments of the present disclosure, since the flow rate of the process gas injected from the nozzle 30 toward the substrate 1 is increased, increasing injection efficiency of the process gas may be obtained.

A distance from the position X1 at which the gas injection hole 32 meets the nozzle 30 to the position X4 at which the process gas is injected from the nozzle protrusion 100*b* may be defined as a nozzle protrusion length Length_N. The nozzle protrusion length Length_N may be, for example, 28□.

As the nozzle protrusion length Length_N increases, a distance EG from the end X4 of the nozzle protrusion 100*b* to an edge X5 of the substrate 1 may decrease. That is, as the distance EG decreases, the amount of process gas that is lost until the process gas injected from the nozzle protrusion 100 reaches the substrate 1 may decrease. The distance EG from the end X4 of the nozzle protrusion 100*b* to the edge X5 of the substrate 1 may be, for example, greater than 0 mm and less than 12 mm.

A change in process gas injection efficiency according to a structural change in the semiconductor manufacturing apparatus according to embodiments of the present disclosure will now be described from various perspectives with reference to FIGS. 5 through 9.

Figure 5:
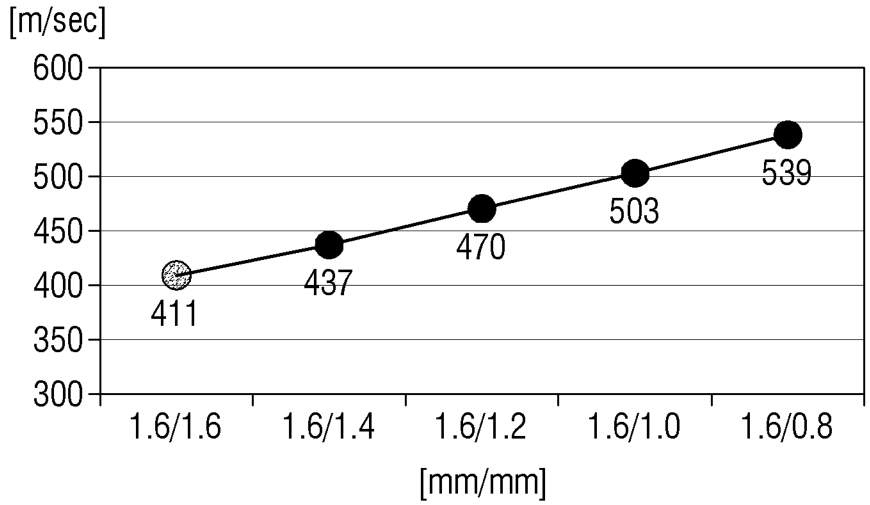
FIG. 5 is an exemplary graph illustrating the discharge rate of a process gas at a point X2 according to the ratio of W1 to W2 of FIG. 4.

FIG. 5 is an exemplary graph illustrating the discharge rate of a process gas at a point X2 according to the ratio of W1 to W2 of FIG. 4.

Referring to FIGS. 4 and 5, a change in the flow rate of the process gas at the outlet X2 according to a change in the second diameter W2 with respect to the first diameter W1 in the semiconductor manufacturing apparatus according to the embodiments of the present disclosure may be observed.

The fraction on the x axis of the graph of FIG. 5 represents the first diameter W1/the second diameter W2. The y axis represents the flow rate of the process gas at the outlet X2 according to the ratio of the first diameter W1 to the second diameter W2.

As apparent from the graph of FIG. 5, in the semiconductor manufacturing apparatus according to embodiments of the present disclosure, the flow rate of the process gas at the outlet X2 increases as the diameter W2 of the outlet 34 decreases compared with the diameter W1 of the outlet 33 of the gas injection hole 32.

For example, when the diameter W1 of the inlet 33 of the gas injection hole 32 is 1.6 mm and the diameter W2 of the outlet 34 is 1.6 mm, the flow rate of the process gas at the outlet X2 may be 411 m/sec. In addition, for example, when the diameter W1 of the inlet 33 of the gas injection hole 32 is 1.6 mm and the diameter W2 of the outlet 34 is 1.4 mm, the flow rate of the process gas at the outlet X2 may be 437 m/sec. In addition, for example, when the diameter W1 of the inlet 33 of the gas injection hole 32 is 1.6 mm and the diameter W2 of the outlet 34 is 1.2 mm, the flow rate of the process gas at the outlet X2 may be 470 m/sec. In addition, for example, when the diameter W1 of the inlet 33 of the gas injection hole 32 is 1.6 mm and the diameter W2 of the outlet 34 is 1.0 mm, the flow rate of the process gas at the outlet X2 may be 503 m/sec. In addition, for example, when the diameter W1 of the inlet 33 of the gas injection hole 32 is 1.6 mm and the diameter W2 of the outlet 34 is 0.8 mm, the flow rate of the process gas at the outlet X2 may be 539 in/sec.

Figure 6:
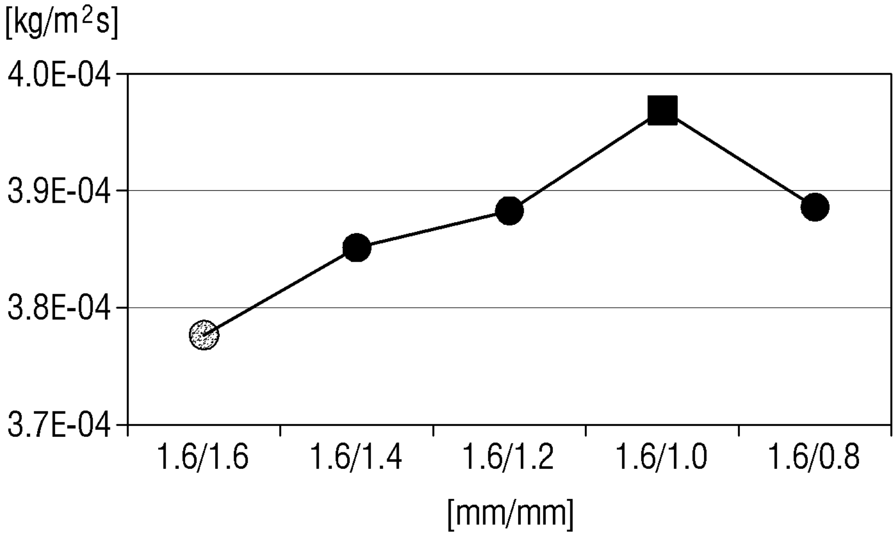
FIG. 6 is an exemplary graph illustrating the flux at the center of a substrate according to the ratio of W1 to W2 of FIG. 4.

FIG. 6 is an exemplary graph illustrating the flux at the center of a substrate according to the ratio of W1 to W2 of FIG. 4.

Referring to FIGS. 4 and 6, a change in the flux of the process gas at the center of the substrate 1 according to a change in the second diameter W2 with respect to the first diameter W1 in the semiconductor manufacturing apparatus according to embodiments of the present disclosure may be observed.

The fraction on the x axis of the graph of FIG. 6 represents the first diameter W1/the second diameter W2. The y axis represents the flux of the process gas at the center C1 of the substrate 1 according to the ratio of the first diameter W1 to the second diameter W2.

The flux may be measured as the product of the flow rate of the process gas and the cross-sectional area through which the process gas passes.

The flux of the process gas at the center C1 of the substrate 1 tends to increase as the diameter W2 of the outlet 34 decreases compared with the diameter W1 of the outlet 33 of the gas injection hole 32. However, there may be an inflection point (1.6 mm/1.0 mm) at which the flux decreases due to a decrease in the cross-sectional area through which the process gas passes.

For example, the flow rate of the process gas at the center C1 of the substrate 1 may have the smallest value when the diameter W1 of the inlet 33 of the gas injection hole 32 is 1.6 mm and the diameter W2 of the outlet 34 is 1.6 mm. In addition, for example, the flow rate of the process gas at the center C1 of the substrate 1 may continue to increase until the diameter W1 of the inlet 33 of the gas injection hole 32 is 1.6 mm and the diameter W2 of the outlet 34 is 1.0 mm. Then, for example, the flow rate of the process gas at the center C1 of the substrate 1 may decrease until the diameter W1 of the inlet 33 of the gas injection hole 32 is 1.6 mm and the diameter W2 of the outlet 34 is 0.8 mm.

Therefore, the semiconductor manufacturing apparatus according to the embodiments may adjust the first diameter W1/the second diameter W2 so that a large flux of process gas is injected to the center C1 of the substrate 1. For example, in the semiconductor manufacturing apparatus according to the embodiments, the flow rate at the center C1 of the substrate 1 may be the maximum when the first diameter W1/the second diameter W2 is 1.6 mm/1.0 mm.

Alternatively, in the semiconductor manufacturing apparatus according to embodiments of the present disclosure, the second diameter W2/the first diameter W1 may be 0.5 to 0.75 so that a large flux of process gas is injected to the center C1 of the substrate 1.

Figure 7:
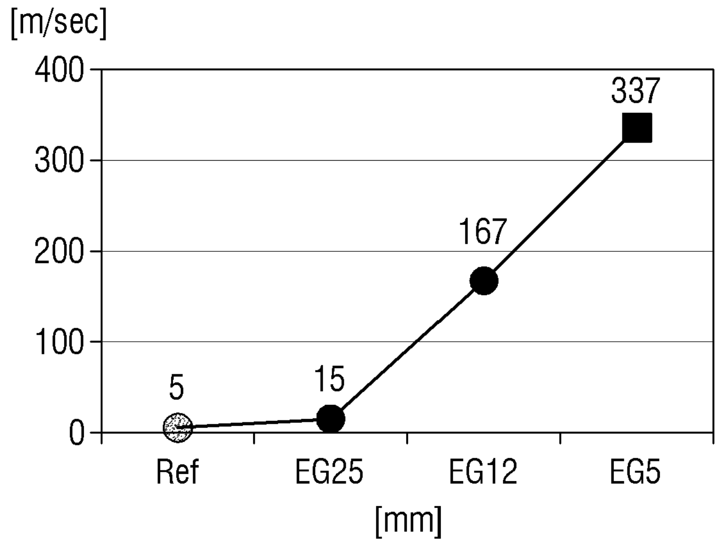
FIG. 7 is an exemplary graph illustrating the discharge rate of a process gas at a point X5 according to a reduction in a distance between an end of a nozzle protrusion and an edge of a substrate.

FIG. 7 is an exemplary graph illustrating the discharge rate of a process gas at a point X5 according to a reduction in a distance between an end of a nozzle protrusion and an edge of a substrate.

Referring to FIGS. 4 and 7, a change in the flow rate of the process gas at the edge X5 of the substrate 1 according to a change in the distance EG between the end X4 of the nozzle protrusion 100*b* and the edge X5 of the substrate 1 in the semiconductor manufacturing apparatus according to embodiments of the present disclosure may be observed.

In the graph of FIG. 7, the x axis represents the distance BG between the end X4 of the nozzle protrusion 100*b* and the edge X5 of the substrate 1. The y axis represents the flow rate of the process gas at the edge X5 of the substrate 1.

In the graph of FIG. 7, Ref of the x axis represents a case where the distance between the end X4 of the nozzle protrusion 100*b* and the edge X5 of the substrate 1 is 33 mm. EG25 of the x axis represents a case where the distance between the end X4 of the nozzle protrusion 100*b* and the edge X5 of the substrate 1 is 25 mm. EG12 of the x axis represents a case where the distance between the end X4 of the nozzle protrusion 100*b* and the edge X5 of the substrate 1 is 12 mm. EG5 of the x axis represents a case where the distance between the end X4 of the nozzle protrusion 100*b* and the edge X5 of the substrate 1 is 5 mm.

In the graph of FIG. 7, Ref of the x axis represents a case where the distance between the end X4 of the nozzle protrusion 100*b* and the edge X5 of the substrate 1 is 33□. EG25 of the x axis represents a case where the distance between the end X4 of the nozzle protrusion 100*b* and the edge X5 of the substrate 1 is 25□. EG12 of the x axis represents a case where the distance between the end X4 of the nozzle protrusion 100*b* and the edge X5 of the substrate 1 is 12□. EG5 of the x axis represents a case where the distance between the end X4 of the nozzle protrusion 100*b* and the edge X5 of the substrate 1 is 5□.

It can be seen from the graph of FIG. 7 that the flow rate of the process gas at the edge X5 of the substrate 1 increases as the distance EG between the end X4 of the nozzle protrusion 100*b* and the edge X5 of the substrate 1 decreases.

For example, when the distance between the end X4 of the nozzle protrusion 100*b* and the edge X5 of the substrate 1 is 33 mm, the flow rate of the process gas at the edge X5 of the substrate 1 may be 5 m/sec. In addition, for example, when the distance between the end X4 of the nozzle protrusion 100*b* and the edge X5 of the substrate 1 is 25 mm, the flow rate of the process gas at the edge X5 of the substrate 1 may be 15 m/sec. In addition, for example, when the distance between the end X4 of the nozzle protrusion 100*b* and the edge X5 of the substrate 1 is 12 mm, the flow rate of the process gas at the edge X5 of the substrate 1 may be 167 m/sec. In addition, for example, when the distance between the end X4 of the nozzle protrusion 100*b* and the edge X5 of the substrate 1 is 5 mm, the flow rate of the process gas at the edge X5 of the substrate 1 may be 337 m/sec.

For example, in the semiconductor manufacturing apparatus according to embodiments of the present disclosure, the distance EG between the end X4 of the nozzle protrusion 100*b* and the edge X5 of the substrate 1 may be reduced to increase the flow rate of the process gas at the edge X5 of the substrate 1.

For example, when the distance EG between the end X4 of the nozzle protrusion 100*b* and the edge X5 of the substrate 1 is 5 mm, the flow rate of the process gas at the edge X5 of the substrate 1 may be the maximum.

Figure 8:
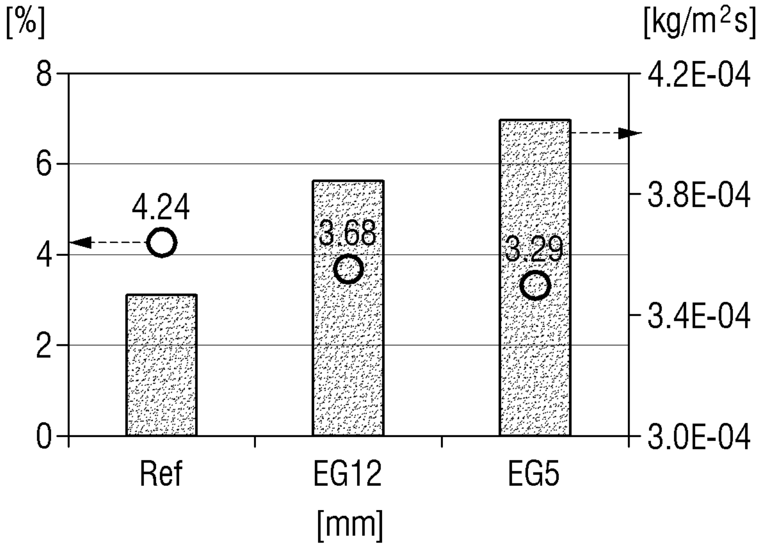
FIG. 8 is a graph illustrating the dispersion of the concentration of a process gas between a plurality of substrates and the average of fluxes of the process gas at the center of each of the substrates according to a change in a distance between an end of a nozzle protrusion and an edge of the substrate.

FIG. 8 is a graph illustrating the dispersion of the concentration of a process gas between a plurality of substrates and the average of fluxes of the process gas at the center of each of the substrates according to a change in a distance between an end of a nozzle protrusion and an edge of the substrate.

Referring to FIGS. 1, 2, 4 and 8, a change in the dispersion of the process gas concentration between a plurality of substrates 1 according to a change in the distance EG between the end X4 of the nozzle protrusion 100*b* and the edge X5 of the substrate 1 in the semiconductor manufacturing apparatus according to embodiments of the present disclosure may be observed. The substrates 1 may refer to a plurality of substrates 1 sequentially stacked in the first direction DR1 as illustrated in FIG. 1.

In the graph of FIG. 8, Ref of the x axis represents a case where the distance between the end X4 of the nozzle protrusion 100*b* and the edge X5 of the substrate 1 is 33 mm. EG12 of the x axis represents a case where the distance between the end X4 of the nozzle protrusion 100*b* and the edge X5 of the substrate 1 is 12 mm EG5 of the x axis represents a case where the distance between the end X4 of the nozzle protrusion 100*b* and the edge X5 of the substrate 1 is 5 mm.

In the graph of FIG. 8, the dispersion of the process gas concentration between the substrates 1 on a left y axis is represented by a circle.

It can be seen from the graph of FIG. 8 that the dispersion of the process gas concentration between the substrates 1 decreases as the distance EG between the end X4 of the nozzle protrusion 100*b* and the edge X5 of the substrate 1 decreases. For example, in the semiconductor manufacturing apparatus according to embodiments of the present disclosure, the distance EG between the end X4 of the nozzle protrusion 100*b* and the edge X5 of the substrate 1 may be reduced to reduce the dispersion of the process gas concentration between the substrates 1. Accordingly, a relatively uniform process gas may be formed between the substrates 1 under certain process conditions. For example, the yield of the semiconductor manufacturing apparatus according to the embodiments of the present disclosure can be increased by reducing the distance EG between the end X4 of the nozzle protrusion 100*b* and the edge X5 of the substrate 1.

For example, when the distance between the end X4 of the nozzle protrusion 100*b* and the edge X5 of the substrate 1 is 33, the dispersion may be 4.24%. In addition, for example, when the distance between the end X4 of the nozzle protrusion 100*b* and the edge X5 of the substrate 1 is 12 mm, the dispersion may be 3.68%. In addition, for example, when the distance between the end X4 of the nozzle protrusion 100*b* and the edge X5 of the substrate 1 is 5 mm the dispersion may be 3.29%.

That is, when the distance between the end X4 of the nozzle protrusion 100*b* and the edge X5 of the substrate 1 is 12 mm, the dispersion may be improved by about 13% as compared with when the distance between the end X4 of the nozzle protrusion 100*b* and the edge X5 of the substrate 1 is 33 mm. In addition, when the distance between the end X4 of the nozzle protrusion 100*b* and the edge X5 of the substrate 1 is 5 mm, the dispersion may be improved by about 23% as compared with when the distance between the end X4 of the nozzle protrusion 100*b* and the edge X5 of the substrate 1 is 33 mm.

Referring to FIGS. 4 and 8, a change in the average of the fluxes of the process gas at the center of each of the substrates 1 according to a change in the distance EG between the end X4 of the nozzle protrusion 100*b* and the edge X5 of the substrate 1 in the semiconductor manufacturing apparatus according to embodiments of the present disclosure may be observed. The substrates 1 may refer to a plurality of substrates 1 sequentially stacked in the first direction DR1 as illustrated in FIG. 1.

In the graph of FIG. 8, the average of the fluxes of the process gas at the center C1 of each of the substrates 1 on a right y axis is represented by a bar graph.

It can be seen from the graph of FIG. 8 that the average of the fluxes of the process gas at the center of each of the substrates 1 increases as the distance EG between the end X4 of the nozzle protrusion 100*b* and the edge X5 of the substrate 1 decreases.

For example, when the distance between the end X4 of the nozzle protrusion 100*b* and the edge X5 of the substrate 1 is 33 mm, the flux may be the smallest. In addition, for example, when the distance between the end X4 of the nozzle protrusion 100*b* and the edge X5 of the substrate 1 is 5 mm, the flux may be the highest.

For example, in the semiconductor manufacturing apparatus according to embodiments of the present disclosure, the distance EG between the end X4 of the nozzle protrusion 100*b* and the edge X5 of the substrate 1 may be reduced to increase the average of the fluxes of the process gas at the center of each of the substrates 1.

Figure 9:
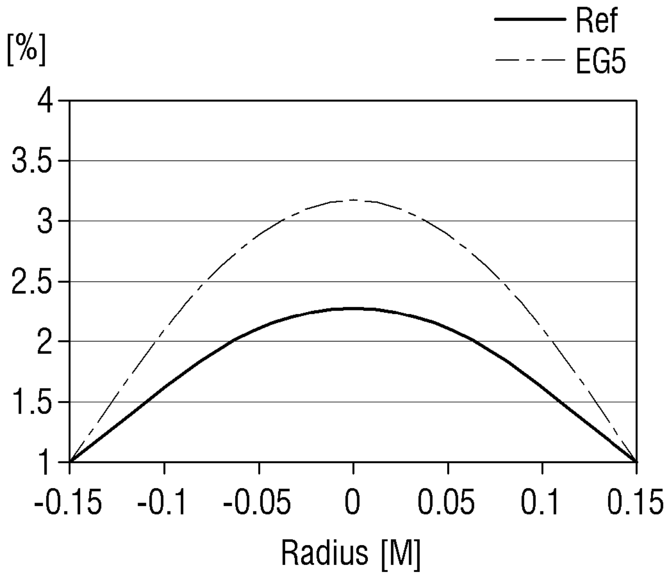
FIG. 9 is an exemplary graph illustrating the concentration dispersion of a process gas in a substrate according to a change in a distance between an end of a nozzle protrusion and an edge of the substrate.

FIG. 9 is an exemplary graph illustrating the concentration dispersion of a process gas in a substrate according to a change in a distance between an end of a nozzle protrusion and an edge of the substrate.

Referring to FIGS. 4 and 9, the concentration dispersion of the process gas in the substrate 1 according to a change in the distance EG between the end X4 of the nozzle protrusion 100*b* and the edge X5 of the substrate 1 may be observed.

In the graph of FIG. 9, the x axis represents the position of each edge (−0.15M and 0.15M) from the center C1 or 0 of the substrate 1. That is, the position indicated by −0.15M of the x axis may be the edge X5 of the substrate 1 of FIG. 4. The y axis represents the normalized concentration of the process gas on the substrate 1. A solid line represents concentration dispersion when the reference distance Ref between the end X4 of the nozzle protrusion 100*b* and the edge X5 of the substrate 1 is 33 mm. A dash-dotted line represents concentration dispersion on a wafer when the distance EG between the end X4 of the nozzle protrusion 100*b* and the edge X5 of the substrate 1 is 5 mm which is reduced from the reference distance Ref.

It can be seen from the graph of FIG. 9 that the process gas concentration not only at the center 0 of the substrate 1 but also in the overall area of the substrate 1 can be increased by reducing the distance BG between the end X4 of the nozzle protrusion 100*b* and the edge X5 of the substrate 1.

For example, in the semiconductor manufacturing apparatus according to embodiments of the present disclosure, the distance BG between the end X4 of the nozzle protrusion 100*b* and the edge X5 of the substrate 1 may be reduced to increase the concentration of the process gas injected onto the substrate 1.

Figure 10:
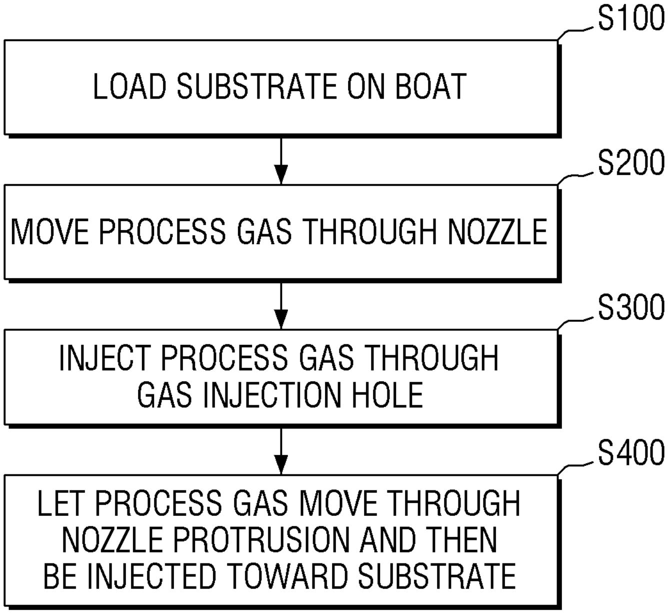
FIG. 10 is an exemplary flowchart illustrating a substrate treatment method of a semiconductor apparatus according to embodiments of the present disclosure.

FIG. 10 is an exemplary flowchart illustrating a substrate treatment method of a semiconductor apparatus according to embodiments.

Referring to FIGS. 2 and 10, the semiconductor apparatus according to embodiments of the present disclosure may load a substrate 1 on a boat 20 (operation S100), move a process gas through a nozzle 30 (operation S200), and inject the process gas through a gas injection hole 32 (operation S300). Here, the process gas may move along nozzle protrusions 100*a*, 100*b* and/or 100*c* and may be injected toward the substrate (operation S400).

In concluding the detailed description, those skilled in the art will appreciate that many variations and modifications may be made to the described embodiments without substantially departing from the principles of the present disclosure.

The invention claimed is:

1. A batch-type semiconductor manufacturing apparatus, comprising:

a boat on which a substrate is loaded in a first direction;

an inner tube at least partially covering the boat;

a nozzle extending primarily in the first direction and configured to provide a process gas to the substrate therethrough;

a nozzle tube at least partially surrounding the nozzle and comprising a gas injection hole configured to inject the process gas toward the substrate; and a nozzle protrusion connected to the gas injection hole and extending primarily in a second direction, wherein a shortest distance from an end of the nozzle protrusion to an edge of the substrate is greater than 0 mm and less than 9 mm, wherein the gas injection hole comprises an inlet having a first diameter and an outlet having a second diameter, wherein the process gas is introduced into the inlet through the nozzle, wherein the process gas is discharged from the inlet toward the outlet, and wherein a value obtained by dividing the second diameter by the first diameter is 0.5 to 0.75.

2. The apparatus of claim 1, wherein the nozzle protrusion is disposed within a slit opening stacked in the first direction.

3. The apparatus of claim 1, further comprising a slit and a slit opening which are stacked in the first direction along a sidewall of the boat.

4. The apparatus of claim 1, wherein the first diameter is greater than the second diameter.

5. The apparatus of claim 1, wherein a flow passage surface defined as a surface where the gas injection hole and the nozzle tube meet, is curved.

6. The apparatus of claim 5, wherein a curvature of the flow passage surface is greater than 0 mm and less than 0.5 mm.

7. The apparatus of claim 2, wherein the slit opening includes a plurality of slit openings, the nozzle protrusion includes a plurality of nozzle protrusions and the number of slit openings in the plurality of slit openings and the number of nozzle protrusions in the plurality of nozzle protrusions are the same.

8. The apparatus of claim 1, further comprising an auxiliary nozzle.

9. The apparatus of claim 8, wherein the auxiliary nozzle includes a plurality of auxiliary nozzles.

* * * * *